(12) United States Patent
Rangarajan et al.

(10) Patent No.: US 7,153,364 B1
(45) Date of Patent: Dec. 26, 2006

(54) RE-CIRCULATION AND REUSE OF DUMMY-DISPENSED RESIST

(75) Inventors: Bharath Rangarajan, Santa Clara, CA (US); Ramkumar Subramanian, San Jose, CA (US); Khoi A. Phan, San Jose, CA (US); Ursula Q. Quinto, San Jose, CA (US); Michael K. Templeton, Atherton, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 649 days.

(21) Appl. No.: 10/000,208

(22) Filed: Oct. 23, 2001

Related U.S. Application Data (60) Provisional application No. 60/242,638, filed on Oct. 23, 2000.

(51) Int. Cl.
 *B05B 1/28* (2006.01)
 *B05B 15/04* (2006.01)
 *B05B 3/00* (2006.01)

(52) U.S. Cl. .................. 118/326; 118/323; 118/52; 118/612

(58) Field of Classification Search .............. 118/321, 118/323, 326, 52, 612; 427/240, 345, 425; 239/110; 396/604, 611; 134/153, 198
See application file for complete search history.

(56) References Cited

U.S. PATENT DOCUMENTS

| | | |
|---|---|---|
| 4,190,015 A | 2/1980 | Hillman |
| 4,286,541 A | 9/1981 | Blackwood |
| 4,785,760 A * | 11/1988 | Tholome ............... 118/323 |
| 4,803,946 A * | 2/1989 | Ravishankar ........... 118/52 |
| 4,886,012 A | 12/1989 | Ikeno et al. |
| 5,002,008 A | 3/1991 | Ushijima et al. |
| 5,020,200 A | 6/1991 | Mimasaka et al. |
| 5,061,156 A | 10/1991 | Kuehne et al. |
| 5,094,884 A | 3/1992 | Hillman et al. |
| 5,134,962 A | 8/1992 | Amada et al. |
| 5,196,064 A | 3/1993 | Branderhorst et al. |
| 5,571,560 A | 11/1996 | Lin |
| 5,756,155 A | 5/1998 | Tzeng et al. |
| 5,849,084 A | 12/1998 | Hayes et al. |
| 5,908,041 A | 6/1999 | Wei et al. |
| 5,938,847 A | 8/1999 | Akimoto et al. |
| 5,965,200 A * | 10/1999 | Tateyama et al. ......... 427/240 |
| 6,013,315 A | 1/2000 | Mandal |
| 6,019,843 A | 2/2000 | Park et al. |
| 6,032,512 A | 3/2000 | Li |
| 6,061,605 A | 5/2000 | Davis |
| 6,371,667 B1 * | 4/2002 | Kitano et al. ........... 396/611 |

* cited by examiner

*Primary Examiner*—Mark A. Osele
*Assistant Examiner*—Yewebdar Tadesse
(74) *Attorney, Agent, or Firm*—Amin, Turocy, & Calvin, LLP (57) ABSTRACT

The present invention provides a system and methodology for dummy-dispensing resist though a dispense head while mitigating waste associated with the dummy-dispense process. The dummy dispensed resist is returned to a reservoir from which it was taken. Between substrate applications, the dispense head can be positioned to dispense resist into a return line. The flow of resist from the dispense head keeps resist from drying at the dispense head. By funneling the dummy-dispensed resist into a return line with low volume, for example, waste from the dummy-dispensing process can be mitigated.

12 Claims, 5 Drawing Sheets

RE-CIRCULATION AND REUSE OF DUMMY-DISPENSED RESIST

REFERENCE TO RELATED APPLICATION

This application claims the benefit of U.S. Provisional Patent Application Ser. No. 60/242,638, which was filed Oct. 23, 2000, entitled RE-CIRCULATION AND REUSE OF DUMMY-DISPENSED RESIST.

TECHNICAL FIELD

The present invention generally relates to semiconductor processing, and in particular to an apparatus for dispensing resist.

BACKGROUND OF THE INVENTION

In the semiconductor industry, there is a continuing trend toward higher device densities. To achieve these higher densities, there have been, and continue to be, efforts toward scaling down the device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features generally requires high resolution lithographic processes. In general, lithography refers to processes for pattern transfer between various media. It is a technique used for integrated circuit fabrication in which a silicon slice, the wafer, is coated uniformly with a radiation-sensitive film, the resist, and the film exposed with a radiation source (such as optical light, x-rays, or an electron beam) that illuminates selected areas of the surface through an intervening master template, the mask, forming a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposed portions of the coating become either more or less soluble (depending on the coating) in a particular solvent developer. The more soluble areas are removed in the developing process to leave the pattern image or its negative in the remaining coating.

Uniform and consistent resist coating is important to obtaining extremely fine patterns after exposure of the resist. For example, a coating thickness should vary by no more than ±100 Å across the wafer surface and from wafer to wafer. Although spray coating, meniscus coating, roller coating, curtain coating, extrusion coating, plasma deposition, and electrophoresis have all been used to apply resist coatings, spin coating is the usual method.

In a typical spin coating process, a small quantity of resist solution is dripped or sprayed onto a semiconductor substrate. The resist may be applied to the center of the substrate or in a pattern from center to edge. The resist may be applied in a helix pattern, for example, by slowly turning the wafer while scanning a dispense head from center to edge. The resist is initially spread across the surface by spinning the substrate at low speeds, (e.g., 200 rpm for 1 second). Then the spin rate is rapidly ramped up to a final spin speed in the 3000 to 7000 rpm range. The thickness of the final coating can depend on many parameters such as volume of solution dispensed, substrate diameter, resist solution viscosity, spin speed during dispense, rate of acceleration to final spin-speed, and final spin speed. Small changes, caused for example by the evaporation of solvent during spin-speed ramp-up, can significantly affect coating thickness.

Clean conditions must be maintained to avoid defects in the resist coating. The resist should be clean and free of particles above 0.2 μm in diameter. Because the resist is sticky, it can easily entrap airborne particles. Therefore, resist coating should be carried out in a Class-100 or better environment. Defects can also be caused by air bubbles entrapped in the resist.

A common cause of defects and variability in resist coatings is the tendency of resists to dry rapidly and form residues on the dispense head. These residues can occlude the dispense head orifice, affecting the amount and pattern in which the resist is dispensed. In addition, flakes of dried resist and particles that crystalize from the resist solution as it dries may contaminate the resist solution or fall directly onto the substrates.

One way to avoid having resist solution dry at the dispense head is to maintain a steady flow of resist through the dispense head in between applications. This is called dummy dispensing. This method can be effective, but resist solutions are expensive and the amount of wasted resist involved in dummy dispensing cause this method to be prohibitive.

Another approach is to flush the dispense head with solvent between uses. One difficulty with this approach is that solvent in the dispense head may dilute subsequently dispensed resist solution. Diluting the resist solution affects its viscosity and results in variable coating thickness. The dispense head can be flushed with resist solution before dispensing on substrates, but as with dummy dispensing this involves the waste of expensive resist solution. The dispense head can also be submerged in a solvent between uses, with similar consequences.

Another idea is to place the dispense head, between uses, under an atmosphere saturated with solvent. Unfortunately, it is difficult to maintain the correct solvent atmosphere, particularly in a location in which the dispense head can be easily placed and removed. Additionally, the required apparatus is complicated and residues may still form.

Other measures can be taken to reduce the extent to which resist dries on the dispense head. A vacuum suck-back in the resist solution supply line can reduce the amount of resist drying on the dispense head. A non-stick coating can improve the effectiveness of the vacuum suck-back. However, some resist remains in the dispense head and the remaining resist tends to dry very quickly.

Dispense heads may also be constructed so that they can be frequently changed. This approach may be employed to avoid defective coatings, but only at the price of expense, equipment downtime, and inconvenience.

In view of the above, there remains an unsatisfied need for an apparatus and method of dispensing resist that is convenient, uncomplicated, does not waste expensive resist solution, and keeps the dispense head relatively free of residues and contaminates.

SUMMARY OF THE INVENTION

The present invention relates to a system and methodology to facilitate dispensing a resist while promoting a relatively free-flow of the resist through a dispense head, yet mitigating waste associated with a dummy-dispensing process. This can be achieved by employing a dummy-dispensed resist through the dispense head to facilitate a substantially unimpeded application of the resist in the dispense head in support of a lithographic process, wherein dummy-dispensing of the resist can occur at times other than when the lithographic process occurs. Resist that is employed in the dummy-dispense process can then be captured in a reservoir and returned to the dispense head in a re-circulative manner in order to mitigate waste.

Between substrate applications of the resist for example, the dispense head can be positioned to dispense resist into a return line, wherein the flow of resist from the dispense head mitigates having the resist dry at the dispense head. By funneling the dummy-dispensed resist into a return line with low volume, for example, the dispense head can generally be kept free of residues while the dummy-dispensed resist can be substantially preserved and reused.

In one aspect, the invention provides a system for dispensing resist including a reservoir, a nozzle in fluid communication with the reservoir, and a return line in fluid communication with the reservoir, wherein the nozzle is moveable between first and second positions, in the first position, the nozzle is positioned to dispense liquid from the reservoir onto a substrate, and in the second position the nozzle is positioned to dispense liquid from the reservoir into the return line.

In another aspect, the invention provides a system for dispensing resist solution including a reservoir, means for dispensing resist solution from the reservoir onto a substrate, and means for capturing resist solution dispensed by the dispensing means and returning the dispensed fluid to the reservoir.

In a further aspect, the invention provides method of dispensing resist, including the steps of drawing resist from a reservoir, dispensing resist through a dispense head onto a substrate, dummy dispensing resist to reduce or eliminate residues on the dispense head, capturing dummy dispensed resist; and returning dummy dispensed resist to the reservoir.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
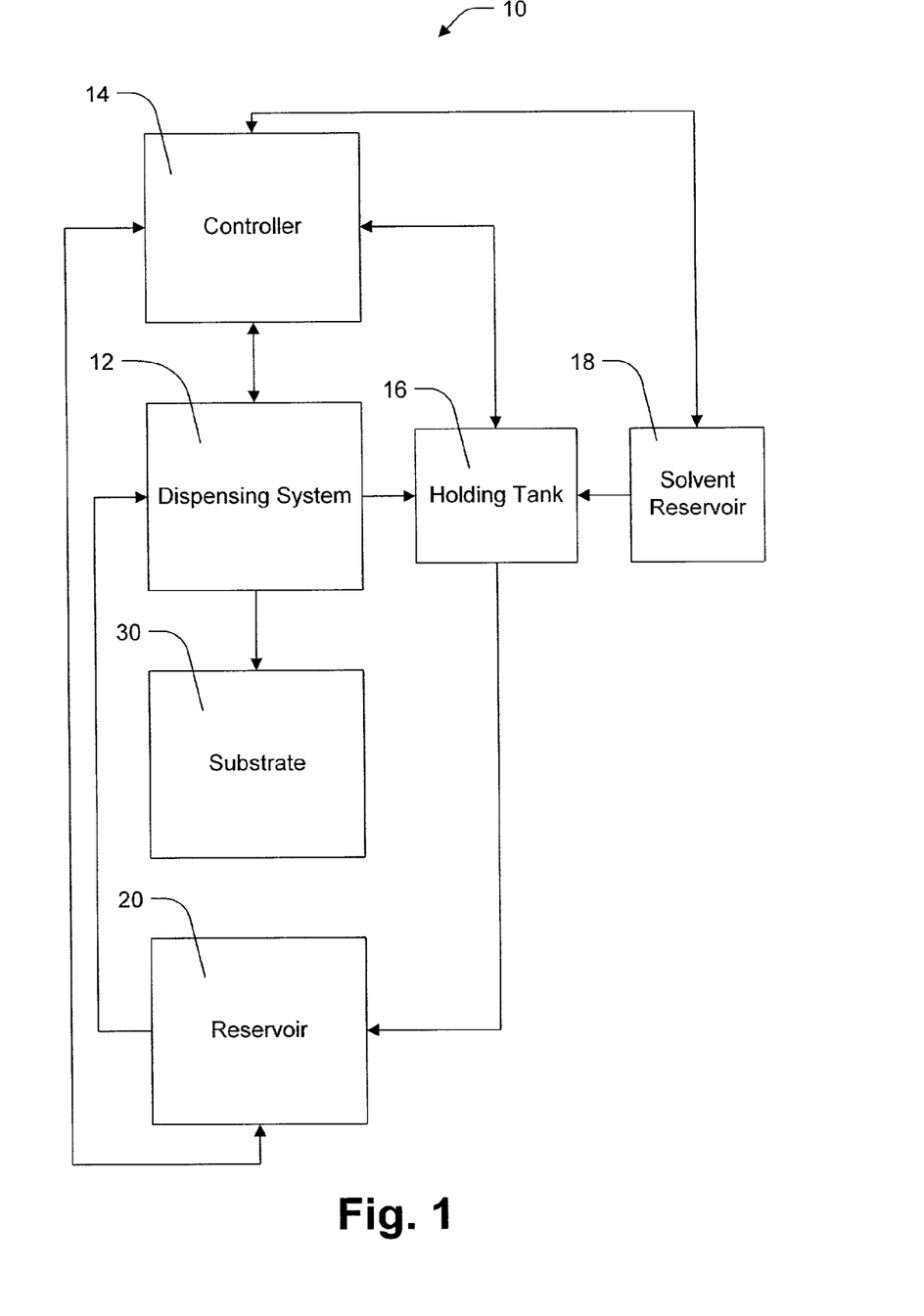
FIG. 1 is a block diagram of a system for dispensing resist according to the present invention.

Referring initially to FIG. 1, a block diagram of a system 10 illustrates resist dispensing according an aspect of the present invention. The system 10 provides a closed loop system that reduces and mitigates drying of resist in a dispense head, for example. The system 10 maintains dispensing of resist at a slow rate, even between resist depositing steps, to reduce drying and yet, mitigates waste of resist by capturing at least some dispensed resist. The system 10 includes a controller 14, dispensing system 12, substrate 30, reservoir 20, holding tank 16 and a solvent reservoir 18.

The controller 14 is operatively coupled to the dispensing system 12, the holding tank 16, the solvent reservoir 18 and the reservoir 20. The controller 14 is adapted to control the operation of the dispensing system 12, the holding tank 16, the solvent reservoir 18 and the reservoir 20, wherein the controller 14 includes at least one processor (not shown) and a memory (not shown) to direct the process. It is noted that the memory within the controller serves to store program code executed by the processor for carrying out operating functions of the system as described herein. The memory may include read only memory (ROM) and random access memory (RAM). The ROM contains, among other code, the Basic Input-Output System (BIOS) which controls the basic hardware operations of the system 10. The RAM is the main memory into which the operating system and application programs are loaded. The memory also serves as a storage medium for temporarily storing information such as monitoring data, acceptable values of static charge, threshold values of static charge, other data and algorithms that may be employed in carrying out the present invention. The memory may additionally include a hard disk drive or other mass storage device. It is also noted that the controller 14 may additionally include an input device and a display (also not shown).

The dispensing system 12 is operatively coupled to the holding tank 16 and the reservoir 20 and generally includes a nozzle and pump, illustrated and described below, to permit delivery of resist to the holding tank 16 or substrate 30 from the reservoir 20. The dispensing system 12 can be configured and controlled to dispense resist at a controllable rate. It is to be appreciated that other characteristics of dispensing resist are also directed by the controller 14. For example, the dispensing system 12 can move or position the nozzle to substantially any location by use of a movable and controllable swing arm (See e.g., reference 813 in FIG. 8). Generally, the dispensing system 12 selectably dispenses resist to the substrate 30 or the holding tank 16 during normal operation.

The dispensing system 12 also provides dispensing feedback data to the controller 14. The feedback data may include information such as, but not limited to, resist flow rate, resist composition, temperature, arm position, nozzle position, errors and the like. For example, if the pump were to become defective, the feedback data may indicate the pump error along with a reduced flow rate.

The holding tank 16 is operative with the dispensing system 12, the reservoir and the solvent reservoir 18, the controller 14 and is employed to capture resist dispensed by the dispensing system 12. The captured resist may be obtained directly from the dispensing system 12, such as by a nozzle of the dispensing system 12 dispensing resist into a coupling of the holding tank or indirectly from a housing that captures extra resist that is received from the substrate 30. The captured resist can also be referred to as a dummy-dispense resist. It is appreciated that a tube or other device may be movably connected to the nozzle of the dispensing system 12 instead of having the nozzle moved to a coupling of the holding tank 16. The holding tank 16 generally keeps a minimum amount of resist in the holding tank 16 and is able to receive a solvent from the solvent reservoir 18 to reduce or mitigate drying of resist. The holding tank 16 can also include a filter to filter out contaminants and air particles from captured resist. The holding tank 16 also provides captured resist to the reservoir 20 at a controllable flow rate as directed by the controller 14. This may be achieved by, for example, via a pump or gravity feed system.

The holding tank 16 also provides holding tank feedback data to the controller 14. This feedback information may include, but is not limited to, information such as tank capacity, filter status, solvent percentage, amount of captured resist, resist capture rate and the like.

The solvent reservoir 18, as stated above, is operative with the holding tank 16 and the controller 14. The solvent reservoir 18 can include a solvent that reduces or prevents drying of resist, for example, and provides the solvent, as needed to the holding tank 16. The solvent reservoir 18 can also provide solvent feedback data to the controller 14. The feedback data may include information such as, tank capacity, solvent remaining, solvent composition and the like. It is appreciated that the solvent reservoir 18 can include one or more types of solvents and can select at least one of the solvents to be provided. Further, the solvent reservoir 18 can control ratios of the at least one solvent to be provided.

The reservoir 20 is operative with the holding tank 16, the dispensing system 12, the controller 14 and provides resist to the dispensing system 12 at a flow rate. The reservoir 20 may have an initial amount of stored resist and receives captured resist from the holding tank 16. The reservoir 20 may be connected to an external resist supply system (not shown) to maintain a minimum amount of resist in the reservoir 20. Alternately, the reservoir 20 may indicate to the controller 14 that more resist needs to be added.

The reservoir 20 also provides reservoir feedback data to the controller 14. The feedback data may include information such as, but not limited to, tank capacity, resist composition, temperature, flow rate, errors and the like. For example, the reservoir 20 may provide feedback data that captured resist from the holding tank 16 is not being received.

The substrate 30 receives dispensed resist from the dispensing system 12. The substrate 30 is typically placed on a chuck within a housing. The chuck is operative to spin the substrate 30 to more evenly distribute resist on the substrate 30. It is to be appreciated that the system 10 is operative to form a layer of resist on the substrate 30. The layer of resist is typically formed having a thickness and uniformity. The formation of this layer is also controllable by the controller 14.

Referring again to the controller 14, the controller 14 can control all of the operations and functions of the system 10. By utilizing feedback data from the other components of the system 10, the controller 14 is responsible for the following functions, maintaining a minimum resist amount in the reservoir 20, reducing or mitigating drying of resist in the holding tank 16, modifying flow rates of resist between the system components and the like. It is appreciated that additional operations and functions may be associated with the system and still be in accordance with the present invention.

Figure 2:
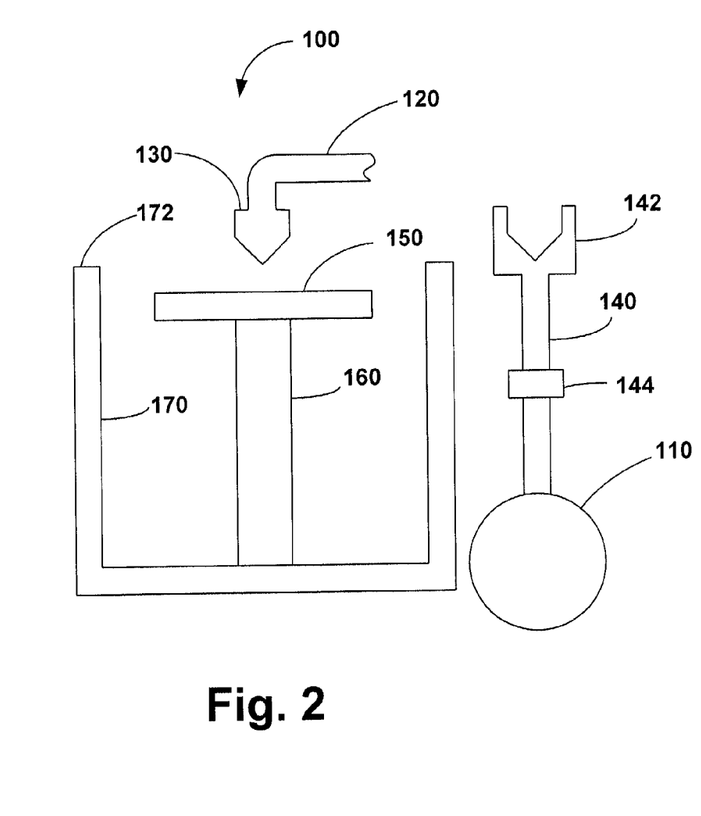
FIG. 2 is schematic of an apparatus according to the present invention with the dispense head in a first position.
Figure 3:
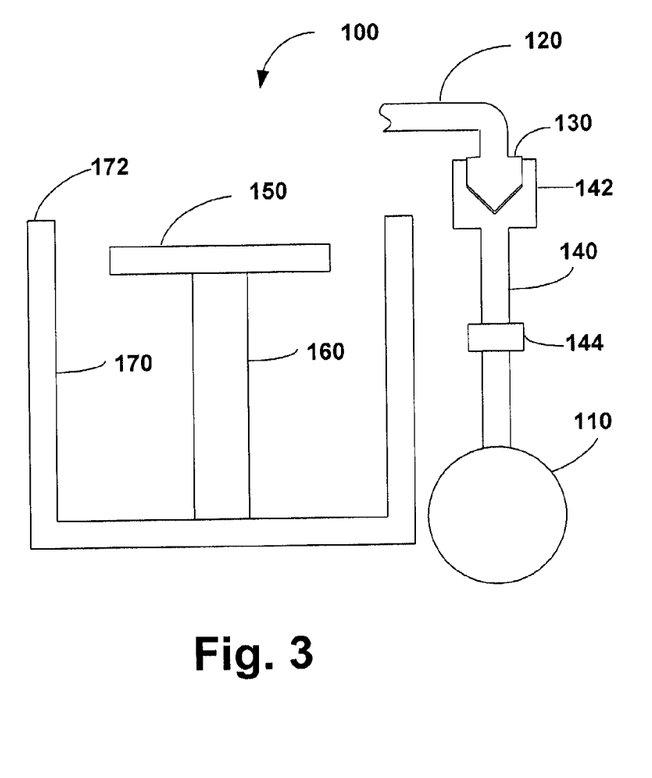
FIG. 3 is schematic of the apparatus of FIG. 2 with the dispense head in a second position.
Figure 4:
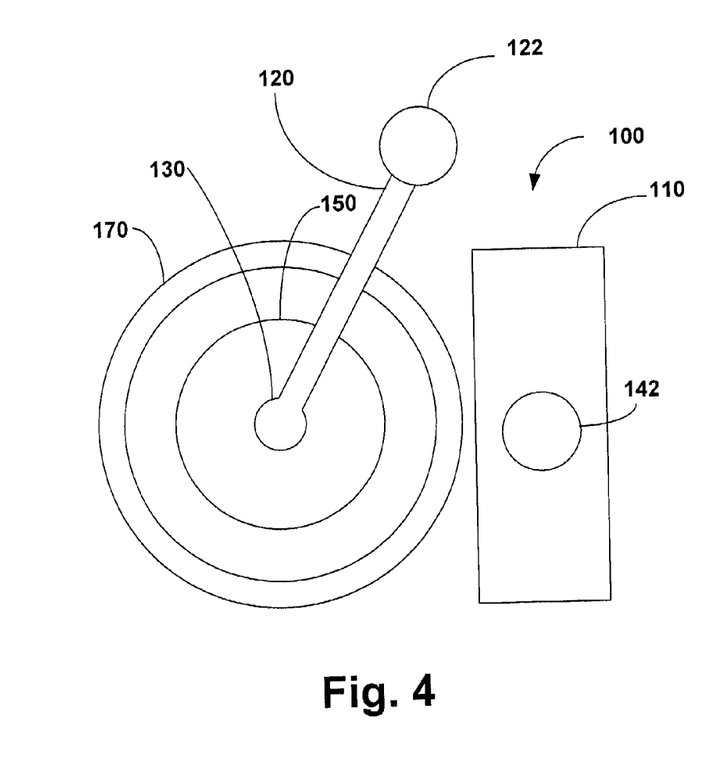
FIG. 4 is another schematic of the apparatus of FIG. 2 with the dispense head in a first position.
Figure 5:
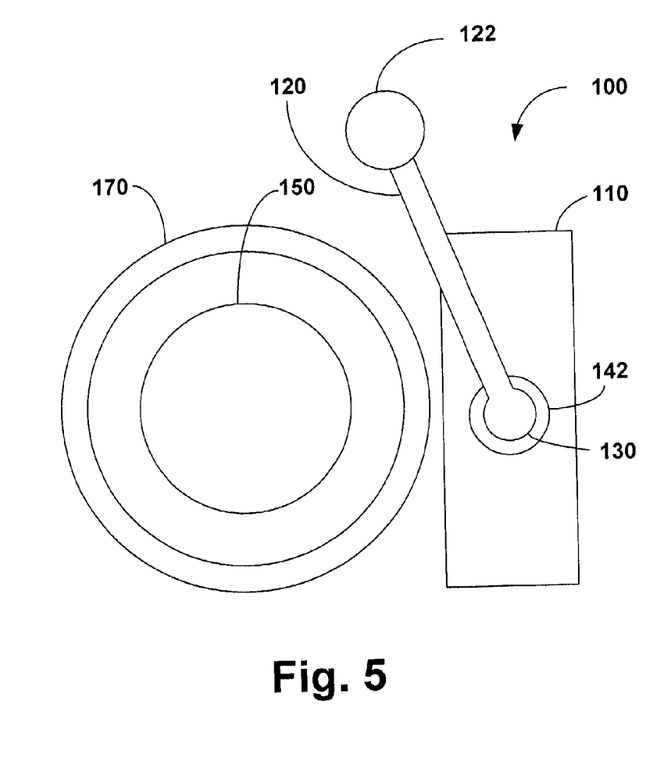
FIG. 5 is another schematic of the apparatus of FIG. 2 with the dispense head in a second position.

FIGS. 2–5 illustrate a system 100 in accordance with the present invention, wherein FIGS. 2 and 3 present a side view, and FIGS. 4 and 5 present a top view of the system. The system 100 includes reservoir 110, swing arm 120, dispense head 130, and return line 140. In operation, swing arm 120 brings dispense head 130 just above the center of substrate 150, which is on chuck 160 within housing 170. After a small quantity of resist from reservoir 110 is dispensed through dispense head 130, swing arm 120 brings dispense head 130 up, over, and down into coupling 142 of return line 140. Resist is then dummy-dispensed into return line 140. The dummy-dispensed resist passes through filter 144 and into reservoir 110.

The reservoir 110 holds resist solution ready for dispensing and receives resist solution captured by the return line 140. If air bubbles have been trapped within the resist from the return line, they will generally separate out in the reservoir. It may be beneficial to provide reservoir 100 with a purge valve for the removal of air that has separated from the resist solution.

The system 100 generally includes a precision metering pump (not shown) between reservoir 110 and dispense head 130. The pump can be, for example, a diaphragm pump, a bellows pump, or a piston actuated pump. The pump can provide a suck-back action that can be used to prevent resist from dripping while the dispense head 130 is being moved. It is noted that dummy-dispensed resist can return to reservoir 110 under the action of gravity.

The dispense head 130 is mounted on swing arm 120 and is in fluid communication with reservoir 110. Swing arm 120 moves dispense head 130 between a first position, which is over the center of substrate 150, to a second position, in which dispensed resist enters return line 140. In the first position, dispense head 130 is preferably within about 5 mm of substrate 150 so that air bubbles are not trapped in the resist solution as it falls to substrate 150.

Swing arm 120 raises, lowers, and pivots about its base 122. Generally, the motion is first raising the dispense head to clear the wall 172 of housing 170, then pivoting until dispense head 130 is over coupling 142, and finally lowering until dispense head 130 mates with coupling 142. A swing arm that operates by moving linearly, for example, in perpendicular directions X, Y, and Z, can also be used. The swing arm does not need to mate dispense head 130 with coupling 142, but, can merely bring the dispense head to a position, wherein dummy-dispensed resist enters the return line. For example, swing arm 120 may position dispense head 130 above an entrance to return line 140.

It is desirable that dispense head 130 be brought within a few millimeters of return line 140 so that air bubbles are not trapped by the dummy-dispensed resist. Bringing the dispense head close to the return line also reduces evaporation of solvent from the dummy-dispensed resist solution. In one aspect, dispense head 130 is brought within about 5 mm of return line 140. In another aspect, dispense head 130 is brought within about 1.5 mm of return line 140. In a further aspect, dispense head 130 is brought into a mating position with return line 140.

Dispense head 130 includes one or more orifices from which resist may be dispensed. These orifices are usually circular, but can be oblong, rectangular, or any other shape. The dispense head may include a spray nozzle, for example a round spray nozzle, a wide-angle round spray nozzle, or a flat spray nozzle. Dispense head 130 may be constructed of any material, including metal, (e.g., steel or brass), or plastic, (e.g., thermoplastic or polypropylene). Dispense head 130 may be coated or constructed from a non-stick material, such as a fluoropolymer, (e.g., fluorinated ethylene propylene (Teflon®) or polytetrafluoroethylene (PTFE)).

Figure 6:
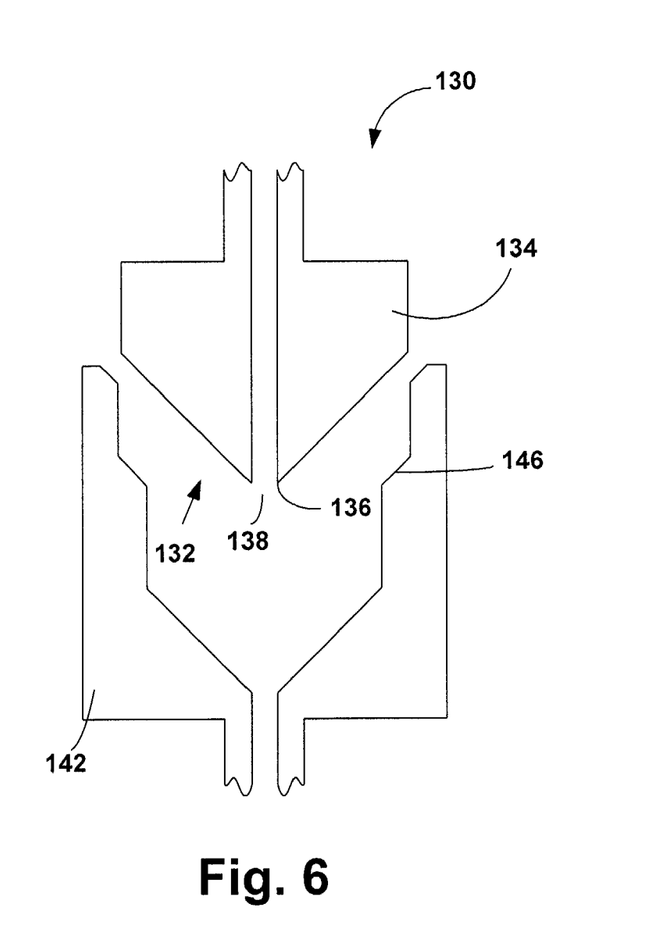
FIG. 6 is an illustration of a nozzle and coupling of the present invention.
Figure 7:
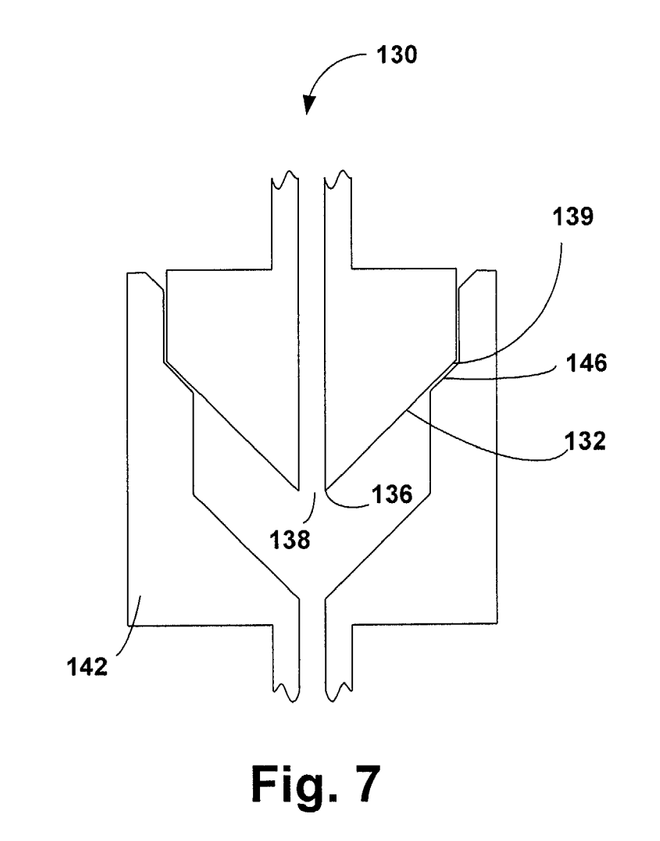
FIG. 7 is an illustration of the nozzle and coupling of FIG. 6 with the two mated together.

FIGS. 6 and 7 illustrate an exemplary dispense head 130. The exemplary dispense head can be designed to drip resist from a single orifice, however, it is to be appreciated that multiple orifice designs are possible. Dispense head 130 includes nozzle tip 132 that can have the shape of a truncated cone, for example. Nozzle tip 132 can be oversized in that its base 134 has a circumference at least about 10 times that of the cone's truncated tip 136 and orifice 138. In this example, orifice 138 occupies the entire truncated tip, but orifice 138 could occupy a smaller portion of the truncated tip. Making nozzle tip 130 oversized facilitates forming a connection with the coupling 142 wherein the mating surfaces do not become fouled with resist, for example.

Coupling 142 has a complimentary shape to dispense head 130 in that coupling 142 and dispense head 130 can be brought together to form a seal. The seal is formed by surface 139 of dispense head 130 and surface 146 of coupling 142, which surfaces mate together. As illustrated by FIG. 7, in the mated position dispense head 130 and coupling 142 form an enclosed vapor space. This space is sufficiently small that it rapidly fills with vapor from dummy-dispensed resist solution. On the other hand, the size of the space is sufficiently large that drops or resist solution forming on dispense head 130 do not contact dispense head 142 until they are released. Because of this, and the width of the space in comparison to the orifice dimensions, resist never reaches surface 146 unless it drips on that surface while dispense head 130 is being moved. Preferably, measures are taken to prevent such dripping, such as providing a suck-back to dispense head 130 after resist has been applied to substrate 150 but before dispense head 130 is moved away from its position over substrate 150. With such measures, resist is prevented from drying and forming residues on any portion of coupling 142.

The volume of return line 140 is generally kept small so that resist flows rapidly to either a holding tank or reservoir 110. This can be facilitated by positioning coupling 142 over the holding tank or reservoir 110. In one aspect, the volume of return line 140 is such that dummy-dispensed resist has a residence time in return line 140, defined as volume of the return line divided by volumetric flow rate, of 100 minutes or less. In another aspect, the residence time is about 10 minutes or less. In a further aspect, the residence time is about 1 minute or less.

The system 100 can include additional means for preventing resist from drying within return line 140, and in particular to prevent resist from drying within return line 140 when dispense head 130 is in its first position. Such means can include a cap for coupling 142. The cap can be placed into mating position with coupling 142, thereby enclosing the vapor space of return line 140 when dispense head 130 is over substrate 150. The cap can be moved out of the way when dispense head 130 is brought to return line 140 and replaced when dispense head 130 is brought back to the area of substrate 150.

Return line 140 can also include a liquid trap to reduce evaporation of solvent and reduce the extent to which resist solution contacts air. The trap is filled with resist solution. When a trap is used, it is advantageously located near the entrance of return line 140, whereby a large portion of return line 140's volume is isolated from the outside air. The use of a trap is particularly beneficial when dispense head 130 does not mate with coupling 142, but remains separated from it by some distance.

Return line 140 is provided with a filter 144. This filter is intended to remove contaminants and/or dried resist that may have gotten into the system. It is also usual to place a filter between reservoir 110 and dispense head 130. When a filter of the later type is used, filter 144 may be redundant.

In the system 100, return line 140 exhausts into reservoir 110. However, the invention includes systems in which the return line leads to a holding tank and that the resist remain in the holding tank for a period of time before being returned to reservoir 110. If a holding tank is employed, it is preferable that it contain some resist, in order that a substantial volume of solvent is not lost from the resist. In one aspect, the holding tank contains at least about 1% resist by volume, in another aspect, the holding tank contains at least about 5% resist by volume. In another aspect, the holding tank contains at least 15% resist by volume. Returning the resist directly to reservoir 110 facilitates that the resist is being discharged into a tank containing a substantial amount of resist in comparison to the tank's volume.

It is noted that the resist to be dispensed can be organic or inorganic and can be a photoresist responsive to visible light, ultraviolet light, x-rays, and/or it can be an electron beam resist or an ion beam resist. Although negative tone resists tend to be high viscosity compared to positive tone resists, the invention is applicable to positive and negative tone resists whether high viscosity or low viscosity.

The systems for dispensing resist and methods of dispensing resist of the invention may be employed to dispense other compounds. They are useful in dispensing, in a controlled manner, substantially any compound that is prone to drying at the dispense head and which cannot be economically disposed of.

In a process provided by the invention, the dispense head 130 is brought to a first position, from which fluid pumped from resist 130 may be dripped or sprayed onto substrate 150. After resist has been dispensed, a suck-back action can be applied to clear dispense head 130 of excess resist that might drip. The dispense head 130 is then moved to a second position.

In the second position, dispense head 130 is positioned to dispense resist into a return line. The dispense head can be positioned above the return line, or it may engage a coupling on the return line. An issue to consider is to generally avoid permitting excessive solvent loss from portions of the resist, whether on the dispense head, around the entrance to the return line, or within the return line.

Resist is then dummy-dispensed into the return line. In one aspect, where a pump is used, the flow rate of dummy-dispensed resist may be from about 1 to 100% of the pump's capacity. In another aspect, the flow rate can be from about 1 to about 10% of the pump's capacity. Alternatively, the flow rate of dummy-dispensed resist may be from about 1 to about 100 drops per minute. In a further aspect, the flow rate of dummy-dispensed resist can be from about 10 to about 50 drops per minute.

The resist from the return line can be expelled into a holding tank or into the reservoir 110. Where a holding tank is used, the resist from the holding tank is eventually returned to reservoir 110. Solvent may be added to the dummy-dispensed resist, or to the reservoir, to compensate for solvent loss that occurs during dummy-dispensing. For this purpose, dummy-dispensed resist can be sampled in either the return line or the holding tank. It can also be beneficial to sample the dummy-dispensed resist to facilitate it has not been contaminated. In one aspect, dummy-dispensed resist is sampled and tested before being returned to reservoir 110. In a further aspect, dummy dispensed resist is returned to reservoir 110 when it is of acceptable quality.

Figure 8:
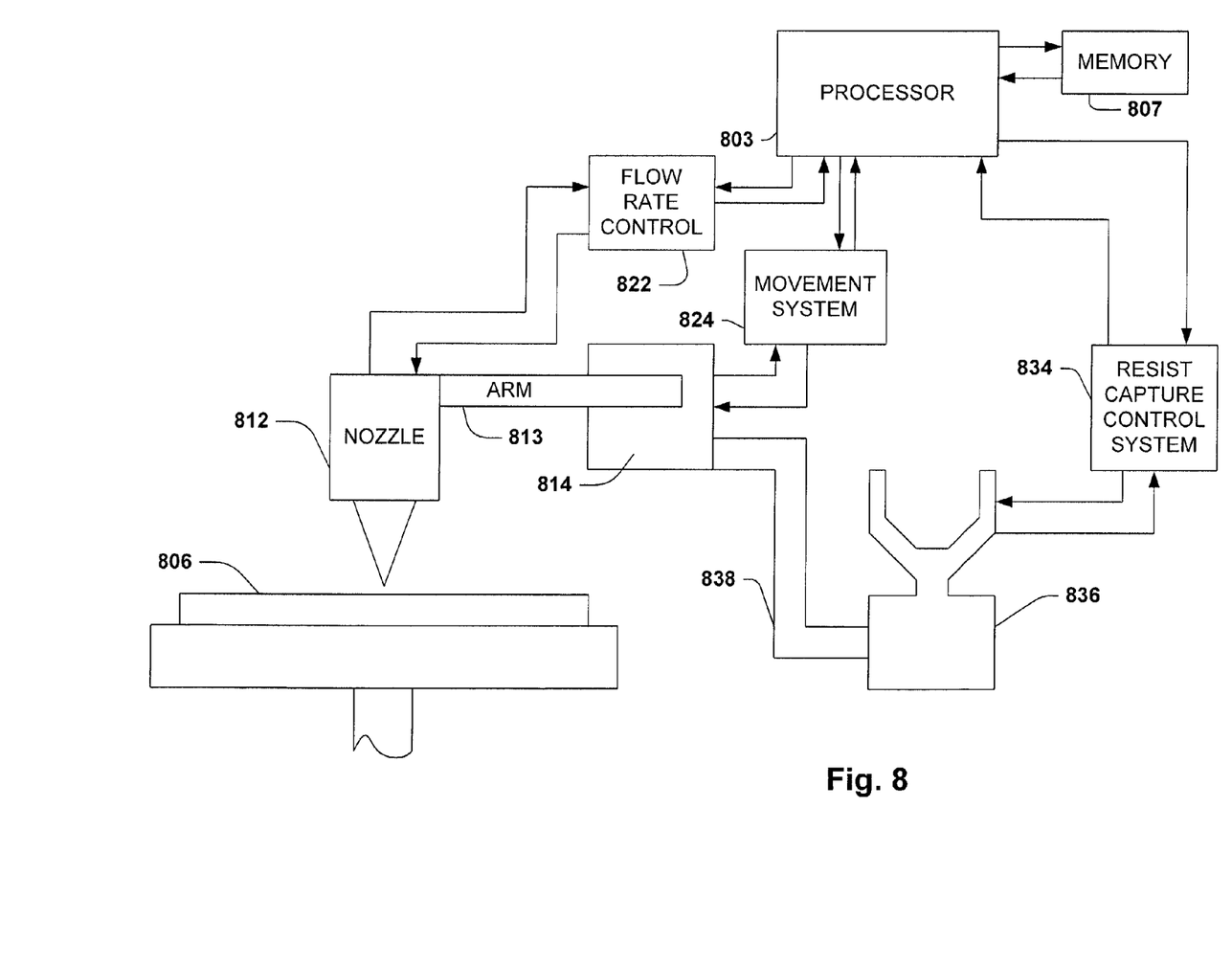
FIG. 8 illustrates a feedback based resist control system according to the present invention.

FIG. 8 illustrates a feedback based resist control system according to the present invention. The system reduces or mitigates drying of resist in a dispense head while conserving resist during a dummy-dispense process. A processor 803 can be any of a plurality of processors, such as the AMD K6, ATHLON and/or other processors. The manner in which the processor 803 can be programmed to carry out the functions relating to the present invention will be readily apparent to those having ordinary skill in the art based on the description herein. A memory 807 is operatively coupled to the processor 803 and serves to store program code executed by the processor for carrying out operating functions of the system as described herein.

A substrate or wafer 806 is shown on a chuck to assist in resist dispensing. A nozzle 812 is included in the system to dispense an antistatic solution. The nozzle 812 is positioned at a location above the substrate 806. The nozzle 812 is able to adjust a flow rate of the resist and is adjustable to reduce or prevent clogging or drying of the nozzle. During resist layer depositing steps, the flow rate is adjusted to so as to deposit a suitable amount of resist on the substrate 806. However, at other times, the resist may dispense at a slow rate. The slow rate is defined as the flow rate of resist necessary to avoid or reduce clogging of the nozzle 812. The nozzle 812 provides feedback data to the processor 830, through the flow rate control system 822, to indicate early stages of clogging so that the flow rate can be adjusted. The flow rate is controlled by a flow rate control system 822. The flow rate control system 822 is connected to the nozzle 812 and the processor 803. The flow rate control system 822 adjusts the flow rate as determined by the processor 803 and based on the feedback data.

A swing arm 813 supports the nozzle 812 and connects the nozzle 812 to the nozzle base 814. The swing arm 813 permits passage of the resist to the nozzle 812. The nozzle base 814 positions the swing arm 813 and thereby the nozzle 812. The nozzle base 814 is movable to adjust positioning of the swing arm 813 and the nozzle 812, in multiple axes, so that the resist can be dispensed as required. Further, the nozzle base 814 is movable to adjust position of the swing arm 813 and the nozzle so that dispensed resist may be captured. The movement of the nozzle base 814 is controlled by the movement control system 824. The movement control system 824 is coupled to the nozzle base 814 and the processor 803 and positions the nozzle 812 as needed during operation. The processor 803 controls the movement system 824 based on the feedback data. The nozzle base 814 receives captured resist from a delivery system 838 which can be a pipe or tubing, for example.

A resist capture device 836 is coupled to the delivery system 838 and can generally be implemented as described above with respect to FIGS. 2–5. The resist capture device 836 is shown with a coupling area able to receive the nozzle 812 and is generally placed close enough to the coupling area to form a seal. However, it is to be appreciated that the resist capture device 836 may utilize other components such as movable resist capture arm (not shown) to capture resist. The resist capture device 836 captures resist dispensed from the nozzle 812 when the nozzle 812 is appropriately located, such as above or attached to the resist capture device 836. The captured resist may also be referred to as dummy dispense resist. The resist capture device 836 includes a reservoir for storing captured resist. The resist capture device 836 provides feedback data to the processor 803 through the resist capture control system 834.

The feedback data may include information such as, but not limited to, remaining resist, resist capacity, flow rate, composition, solvent amounts and the like. The resist capture device 836 can add solvents (not shown) to captured resist to further reduce or prevent clogging or drying of the resist. The resist capture device 836 can include other components such as holding tanks, filters and the like. Further, the resist capture device 836 may be connected to an external resist source to obtain additional resist as necessary. The resist capture device 836 may include a port to expel gas released from the resist. Also, the resist capture device 836 can include a pump or gravity feed system to deliver captured resist to the nozzle 812.

The resist capture control system 834 is connected to the resist capture device 836 and the processor 803. The resist capture control system 834 is generally responsible for controlling all aspects of the resist capture device 836 and facilitating operation of the resist capture device 836. As discussed above, the processor 803 controls the flow rate control system 822, the movement control system 824 and the resist capture control system 834. It is appreciated that a portion or all of the system of FIG. 8 can be employed in other processing steps. For example, the nozzle 812 can be utilized to dispense other solutions such as anti-reflective coatings.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for dispensing resist, comprising:
   a reservoir;
   a nozzle in fluid communication with the reservoir; and
   a return line in fluid communication with the reservoir, the return line has a liquid trap to mitigate fluid evaporation;
   wherein the nozzle is moveable between first and second positions to continuously dispense liquid;
   in the first position, the nozzle is positioned to dispense liquid from the reservoir onto a substrate; and
   in the second position the nozzle is positioned to dummy-dispense liquid from the reservoir into the return line to provide a constant flow of liquid through the nozzle to mitigate residual occlusion accrual in the nozzle.

2. The system of claim 1, the return line has a coupling with a shape complementary to that of the nozzle and the nozzle is fit into the coupling when the nozzle is in the second position.

3. The system of claim 2, the reservoir is below the return line coupling.

4. The system of claim 1, the reservoir has a port out which gas released from liquid in the reservoir is exhausted.

5. The system of claim 1, the nozzle has a tip approximately in the shape of a truncated cone and a circumference of the cone at its base is at least about 10 times a circumference of the cone where it is truncated.

6. The system of claim 1 wherein the nozzle has a tip approximately in the shape of a truncated cone, the tip has an orifice on the truncated end, and a circumference of the cone at its base is at least about 10 times a circumference of the orifice.

7. The system of claim 1, the return line exhausts into a holding tank that is separate from the reservoir.

8. The system of claim 1, wherein the reservoir contains a resist solution.

9. The system of claim 1, wherein the return line is capped when the nozzle is in the first position.

10. The system of claim 1, further comprising a pump that pumps fluid from the reservoir to the nozzle and a fluid from the return line flows into the reservoir by the action of gravity.

11. The system of claim 10, a residence time of resist within the return line is less than about 10 minutes.

12. A system for dispensing resist solution, comprising:
a reservoir for containing resist solution;
means for alternatively dispensing resist solution from the reservoir onto a substrate, and dummy-dispensing resist solution into a means for returning dummy-dispensed resist solution to the reservoir, to provide continuous flow of resist solution through the means for dispensing to mitigate occlusion thereof; and
means for returning dummy-dispensed resist to the reservoir, the means for returning dummy-dispensed resist has a liquid trap to mitigate fluid.

\* \* \* \* \*